United States Patent [19]

Goruganthu et al.

[11] Patent Number: 5,192,913
[45] Date of Patent: Mar. 9, 1993

[54] SEGMENTED CHARGE LIMITING TEST ALGORITHM FOR ELECTRICAL COMPONENTS

[75] Inventors: Rama R. Goruganthu; Thomas K. Myers; Andrew W. Ross, all of Austin, Tex.

[73] Assignee: Microelectronics and Computer Technology Corporation, Austin, Tex.

[21] Appl. No.: 851,716

[22] Filed: Mar. 16, 1992

Related U.S. Application Data

[63] Continuation-in-part of Ser. No. 631,111, Dec. 20, 1990, Pat. No. 5,122,753.

[51] Int. Cl.⁵ .............................................. G01R 31/00
[52] U.S. Cl. ................................. 324/537; 324/158 R; 324/501; 210/310
[58] Field of Search ................... 324/537, 501, 158 R, 324/158 D, 73.1; 250/310, 311

[56] References Cited

U.S. PATENT DOCUMENTS

| | | | |
|---|---|---|---|
| 3,796,947 | 3/1974 | Harrod et al. | 324/501 |
| 4,628,258 | 12/1986 | Lischke | 324/158 P |
| 4,829,243 | 5/1989 | Woodard, Sr. et al. | 324/158 R |
| 4,985,681 | 1/1991 | Brunner et al. | 324/537 |
| 5,045,783 | 9/1991 | Brunner et al. | 324/501 |
| 5,057,773 | 10/1991 | Golladay et al. | 324/501 |
| 5,122,753 | 6/1992 | Myers et al. | 324/537 |

OTHER PUBLICATIONS

Schmidt et al., "Design and Application of an E-beam Test System for Microwiring Substrates," 34th Electron, Ion and Photon Beams Conference, Munich Germany, May 29–Jun. 1, 1990.

Primary Examiner—Jack B. Harvey
Assistant Examiner—Maura K. Regan
Attorney, Agent, or Firm—David M. Sigmond

[57] ABSTRACT

A method of electrically testing an electrical component containing a plurality of networks with at least one node. The method uses segmented, charge limiting testing to charge the nodes and detect shorted or disconnected nodes while preventing accumulated charges in the networks from making uncharged nodes appear charged. The method is well suited for voltage contrast electron beam testing of unpopulated high density multichip modules and interconnect substrates.

35 Claims, 4 Drawing Sheets

SEGMENTED CHARGE LIMITING TEST ALGORITHM FOR ELECTRICAL COMPONENTS

CROSS-REFERENCE TO RELATED APPLICATIONS

This is a continuation-in-part of U.S. application Ser. No. 07/631,111, filed Dec. 20, 1990, now U.S. Pat. No. 5,122,753.

MICROFICHE APPENDIX

Portions of the specification of this application including computer program listings have been submitted as a microfiche appendix, including 1 microfiche film with a total of 14 frames.

BACKGROUND OF THE INVENTION

1. Field of the Invention

The present invention is directed to a method of electrically testing an electrical component containing a plurality of networks with at least one node. More particularly, the invention uses segmented, charge limiting testing to charge the nodes and detect shorted and disconnected nodes while preventing accumulated charges in the networks from making uncharged nodes appear charged.

2. Description of Related Art

Advanced substrate fabrication strategies require judicious use of in-process final test and inspection tools. Automatic test and inspection techniques continually need to be improved to match increasing complexity of advanced electrical components. In addition, test and inspection are often keys in reducing costs and increasing functionality of electrical networks in electrical components.

High packaging densities require finer line and pad size and more wiring levels of interconnection networks in order for a single component to have 10,000 chip-to-board interconnect bonding pads. To reduce costs and increase yields it may be necessary to verify the correctness of each process step where many such steps are used to produce the final component. Electrical testing of sub-assemblies as well as the completed components becomes increasingly difficult as the density of the networks increases and the dimensions of pads decrease. As a result, conventional methods of mechanical probing such as flying probe or bed-of-nails testers are not likely to meet reliability and cost effectiveness standards. New techniques are needed to replace expensive, delicate and short lived mechanical probes that may damage the component being tested.

One such technique is voltage contrast electron beam testing. Electron beams can charge networks of pads within unpopulated substrates as well as dynamically sense (read) the electrical potential of the pads. This discrimination between charged and uncharged pads allows for detection of shorts and disconnects (opens). Voltage contrast electron beam testing requires that the beam be accurately vectored to probe the nodes where it must charge the nodes or measure the node voltages uniformly over large areas. Further, before testing and between complete test sequences an electron flood gun must uniformly remove the charges from the component. The physics of electron beam interactions with various substrate materials governs the ability to charge, read voltage, and erase charge in the materials. Beam parameters must be determined for each set of conductor/insulator substrate materials. Charge retention by the conductor networks must exceed testing times and inadvertent contamination can cause unacceptable leakage resistances. Therefore, substrate material condition, cleaning methods, and conditioning requirements must be specified. Advantageously, electron beams can be positioned by rapid electromagnetic or electrostatic deflection systems based on CAD data alone. Furthermore, electron beams have been used for pad sizes below 100 microns and pad numbers of several tens of thousands. For instance, in "A Dynamic Single E-Beam Short/Open Testing Technique," *Scanning Electron Microscopy*/1985/III (pages 991-999) Brunner et al. report that on a module containing 30,000 pads the charge and read times summed up to less than one minute. Thus, electron beams are an effective tool for testing a wide variety of printed circuit boards, multichip modules, substrates and other electrical components. Voltage contrast electron beam systems are disclosed, for example, in U.S. Pat. Nos. 4,829,243 to Woodard et al. and 4,843,329 to Beha et al.

For a more complete understanding of the present invention, it is necessary to discuss a few related test algorithms. A one-pass test method (nodes tested once for shorts and once for opens) well suited for electron beam testing is taught by R. Schmid et al. in "Design and application of an e-beam test system for microwiring substrates,"*34th Electron, Ion and Photon Beams Conference*, R2, May 29, 1990. Another one-pass test method is disclosed by Myers et al. in U.S. Ser. No. 07/631,111 filed Dec. 20, 1990. Such one-pass algorithms are generally performed by charging a node in a first network and testing the other nodes in the first network for being uncharged (disconnected or open), testing each node in a second network for being charged (shorted) and then charging one node in the second network and testing the remaining nodes in the second network for being uncharged, and repeating this procedure for the remaining networks until either all the nodes have been tested or a defect has been found. Such one-pass tests are relatively fast but ascertain only the existence of opens or shorts in the component.

The necessity of determining the location of any defect depends on the purpose of conducting the test. Various test purposes include (1) determining whether the part is good or bad; (2) identifying bad networks; and (3) a complete functional description of network interconnection. The one-pass open and short testing procedure described above can be employed to discriminate good substrates from bad substrates, which may be sufficient in many cases as the occurrence of defects may be infrequent. The one-pass test which effectively is a simple open and short test may be sufficient particularly where the substrate needs to be labelled good or bad but fault location is not required. The one-pass test may be advantageous since the relatively few decisions, measurements, and charge excitations permit rapid testing. In addition, the one-pass test can be discontinued after the first defect is detected. However, it may be desirable to more fully test the networks to detect more of the defects therein in order to provide further fault information. Myers et al. disclose a two-pass test to provide such information. The first pass comprises the above-mentioned one-pass test with a few additional steps. The second pass algorithms are relatively complicated and shall not be described herein. To summarize, the two-pass tests determine which of the networks are defective; the more sophisticated two-pass test also determines precisely how the faulty nodes or networks are connected and thus details all functional faults.

Unfortunately, performing such tests with electron beam and voltage contrast equipment to detect opens and shorts may cause charge buildup in high density multichip modules. As more and more electrical networks are charged to find opens and shorts, the electrical potential of other networks rises. Depending on the density and design of the multichip module, it is possible for the potential of nodes in the networks which have not been charged to appear as shorted when, in fact, they are not. This drawback is hereinafter referred to as the "accumulated charge effect." Needless to say, there is a need for a charge limiting test algorithm which overcomes the accumulated charge effect.

SUMMARY

The present invention provides segmented test algorithms that prevent false readings due to the accumulated charge effect. A segment is defined as a collection of one or more networks that, when charged, holds too little charge for the accumulated charge effect to occur. After each network is placed in a segment, the first segment is charged and tested without charging any other segments (unless by a defective short to the charged segment). Thereafter, the charges in all the networks are erased and another segment is similarly charged and tested. The charges are again erased and the sequence is continued until either a fault is detected or all the segments have been charged and tested. The repeated erasing of charge between testing different segments eliminates falsely charged (shorted) readings due to the accumulated charge effect.

Such segmented test algorithms, however, may become time consuming, particularly with voltage contrast electron beam testing for high density multichip modules. Testing each segment independently does not ensure exhaustive substrate testing because shorts between segments would not be found. One approach to solving this problem is testing all combinations of segments, however, this is extremely time consuming. The present invention alleviates this problem by providing an accelerated test algorithm which performs segmented testing and charge removal to detect opens and shorts without necessarily having to test every combination of segments.

Accordingly, an object of the present invention is to provide a method of electrically testing an electrical component by testing a portion of the component with an electrical charge, erasing accumulated charges in the component in order to prevent false readings, and then repeating the test step on another portion of the component. This sequence, of course, can be repeated as many times as is necessary. In this and other embodiments the test may include testing the bonding pads on the top major surface of an unpopulated high density multichip module for shorts and disconnects by voltage contrast electron beam testing, erasing the charges by flooding the module, and dividing the bonding pads into segments such that any single segment can be fully charged without causing false readings. That is, the charge is incapable of making any uncharged pad appear as charged after charging each pad (and thus each network) in the current segment.

Another object of the present invention is to provide an accelerated, segmented, charge limiting test for detecting opens and shorts in an electronic component which includes selecting a segment, testing the segment for shorts and disconnects, testing the unselected (never selected) segments for shorts, and then selecting another segment and repeating the procedure. Detecting a shorted node in an unselected segment would accelerate the detection of that fault with respect to exhaustively testing each segment before performing any test on an untested segment.

A feature of the invention includes a method of electrically testing an electrical component with electrical networks having at least one node by grouping the networks into a plurality of segments so that each segment contains one or more networks and each network belongs to a segment, selecting an unselected segment as the current segment, testing the current segment by applying an electrical charge, erasing all charges in the networks after testing the current segment, and repeating the selecting step through the erasing step until either (1) a defective node is detected, or (2) every node has been tested without detecting any defective nodes.

A further feature of the invention includes a method of electrically testing an electrical component with electrical networks having at least one node by grouping the networks into a plurality of segments so that each segment contains one or more networks and each network belongs to a single segment, grouping the segments into a set E, removing a segment from the set E to become the current segment, charging the current segment with a predetermined electrical charge which is insufficient to make any uncharged node in the networks appear charged and testing the current segment for shorted or disconnected nodes, testing the segments remaining in the set E for shorted nodes, erasing all charges in the networks after testing the current segment and testing the segments remaining in the set E, repeating the removing step through the erasing step, and terminating the test after either (1) a node is determined to be shorted or disconnected, thereby indicating the component is bad; or (2) every node has been tested for being shorted or disconnected and no node is determined to be shorted or disconnected, thereby indicating the component is good.

An advantage of the present invention is the ability to perform high throughput, non-contact testing of unpopulated packaging substrates, high density multichip modules, printed wiring boards and printed circuit boards in production and/or inspection environments.

Other and further objects, features and advantages will be apparent from the following description of presently preferred embodiments of the invention, given for the purpose of disclosure, and taken in conjunction with the accompanying drawings.

DETAILED DESCRIPTION OF THE PREFERRED EMBODIMENTS

The present invention provides a segmented, charge limiting test for test algorithms which detect opens and shorts, such as the one-pass algorithm previously described and the first pass of a multi-pass test algorithm such as the two-pass algorithms disclosed in Myers et al., U.S. Ser. No. 07/631,111, filed Dec. 20, 1990, which is the parent of the instant application, assigned to the assignee of the present invention and incorporated herein by reference. In Myers et al. the second pass of the two-pass algorithms charges only the limited number of nodes found defective in the first pass. Therefore, during the second pass the accumulated charge effect does not normally occur and the segmented charge limiting test of the present invention is probably unnecessary, though still applicable to the first pass.

The present invention provides a test method which is not restricted to any particular test system. Any mechanism which has the ability to charge an electrical conductor to a level that can be discriminated from the uncharged state for the duration of the test sequence can be employed. However, it is particularly advantageous to use non-destructive or contactless methods of in-process testing such as voltage contrast electron beam testing by any suitable apparatus, for example as disclosed in U.S. Pat. No. 4,829,243.

To implement the present invention test method, a conventional scanning electron microscope was modified by adding large-field vector deflection, a large-field secondary analyzer, beam blanking, an electron flood gun, and a computer control system, thereby providing the primary test functions required for opens and shorts testing: net charging, net voltage measurement, and global charge removal.

Implicit in the execution of any test process is the requirement to know the conditions that terminate the test. For the present invention, the test is complete when a fault is discovered or all the nodes of all networks are processed without discovering any faults. These conditions encompass all decisions of the test process. It is understood, however, that more than one fault could be required before terminating the test, or the test can proceed regardless of faults.

Figure 1:
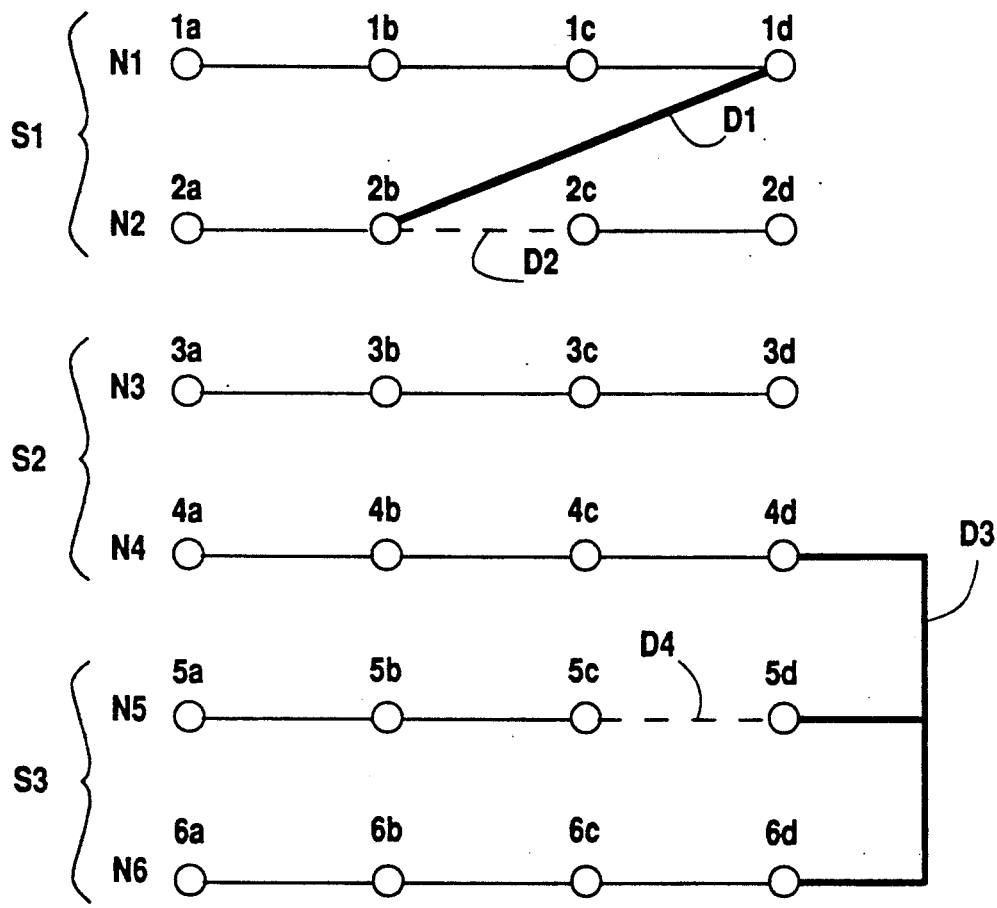
FIG. 1 is an electrical schematic of a plurality of networks in an electrical component, each having at least one node, and in which various electrical defects exist.

Referring now to FIG. 1, for purposes of illustration only, a plurality of electrical networks N1, N2, N3, N4, N5, and N6 are shown. Each network includes at least one node. The networks N1 through N6 may be part of any electrical component, for example, VLSI chip substrates, which may involve thousands of wiring networks in a single package such as a microwiring board with more than 10,000 chip-to-board interconnect bonding pads. As may be seen, network N1 includes nodes 1a, 1b, 1c and 1d. Similarly, network N2 includes nodes 2a, 2b, 2c and 2d, and so on for networks N3 through N6. The component also contains defects D1, D2, D3 and D4. Defect D1 is a short between node 1d on network N1 and node 2b on network N2. Defect D2 is an open or disconnect between nodes 2b and 2c on network N2. Defect D3 is a short between node 4d on network N4, node 5d on network N5, and node 6d on network N6. Finally, defect D4 is an open between nodes 5c and 5d on network N5.

Figure 2:
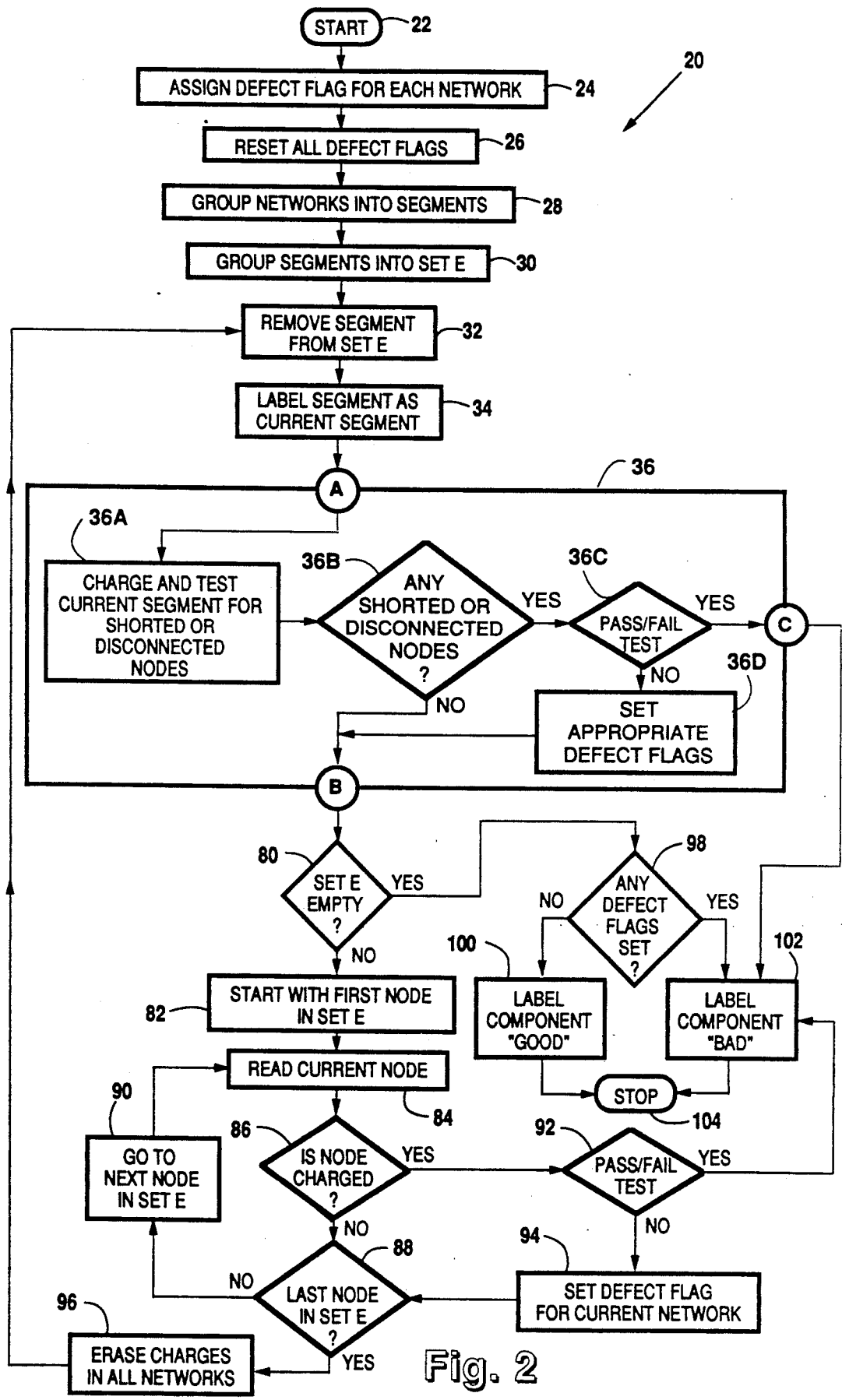
FIG. 2 is a logic diagram illustrating an accelerated, segmented, charge limiting test algorithm in accordance with one embodiment of the present invention.

With reference now to FIG. 2, the present invention method of testing for detecting shorted and disconnected nodes without errors from the accumulated charge effect is shown in logic flow diagram 20. For illustration purposes, an accelerated test shall be described in conjunction with the networks in FIG. 1. In step 22 the test is started and proceeds to step 24 to assign a defect flag to each network. In step 26, all defect flags are reset. Then, in step 28 the networks are grouped into a plurality of segments such that each segment contains one or more networks and each network belongs to a single segment. For example, networks N1 through N6 are grouped into segments S1 through S3 whereby, for a predetermined charge, each segment is incapable of holding enough charge to produce the accumulated charge effect. Segment S1 contains networks N1 and N2, segment S2 contains networks N3 and N4, and segment S3 contains networks N5 and N6. In step 30, all the segments are grouped into a set which is designated "set E." The test proceeds to step 32 and removes a segment, in this case segment S1, from set E. Once removed or selected, segment S1 shall not return to set E. Likewise, at this point in the test segments S2 and S3 are considered unselected or remaining in set E. Step 34 labels the segment just removed in step 32, segment S1, as the "current segment." The test continues in step 36, which comprises steps 36A, 36B, 36C and 36D. In step 36A, the current segment S1 is charged with a predetermined charge and tested for shorted or disconnected nodes. The predetermined charge is sufficiently small to assure that even after all the networks in the current segment are charged, no false readings occur on any nodes in the networks due to the accumulated charge effect. Next, step 36B the detects whether any nodes are shorted or disconnected. If not, the test branches to step 80. If any node is found defective, step 36B branches to pass/fail step 36C. For illustration purposes, the test shall not be a pass/fail test and step 36C branches to step 36D. Step 36D sets the appropriate defect flags, i.e. the defect flag for each network in the current segment found to have a shorted or disconnected node, and the test continues at step 80. If the test were a pass/fail test, step 36C would branch to step 102 which would label the component "BAD", and the test would terminate at step 104 without charging or testing any other nodes.

Figure 3A:
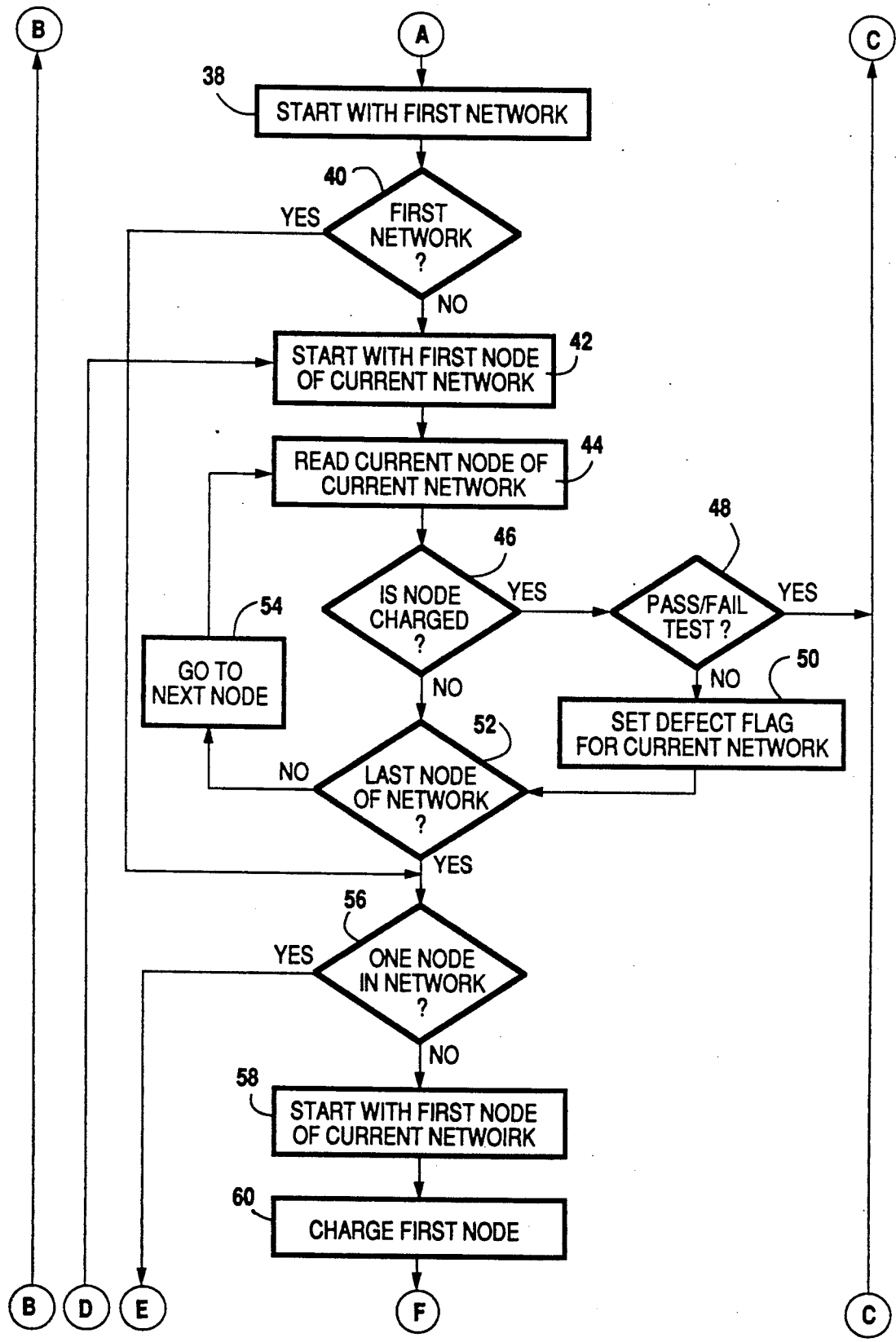
FIGS. 3A-3B are logic diagrams illustrating a one-pass test algorithm for the current segment as depicted in step 36 of FIG. 2.
Figure 3B:
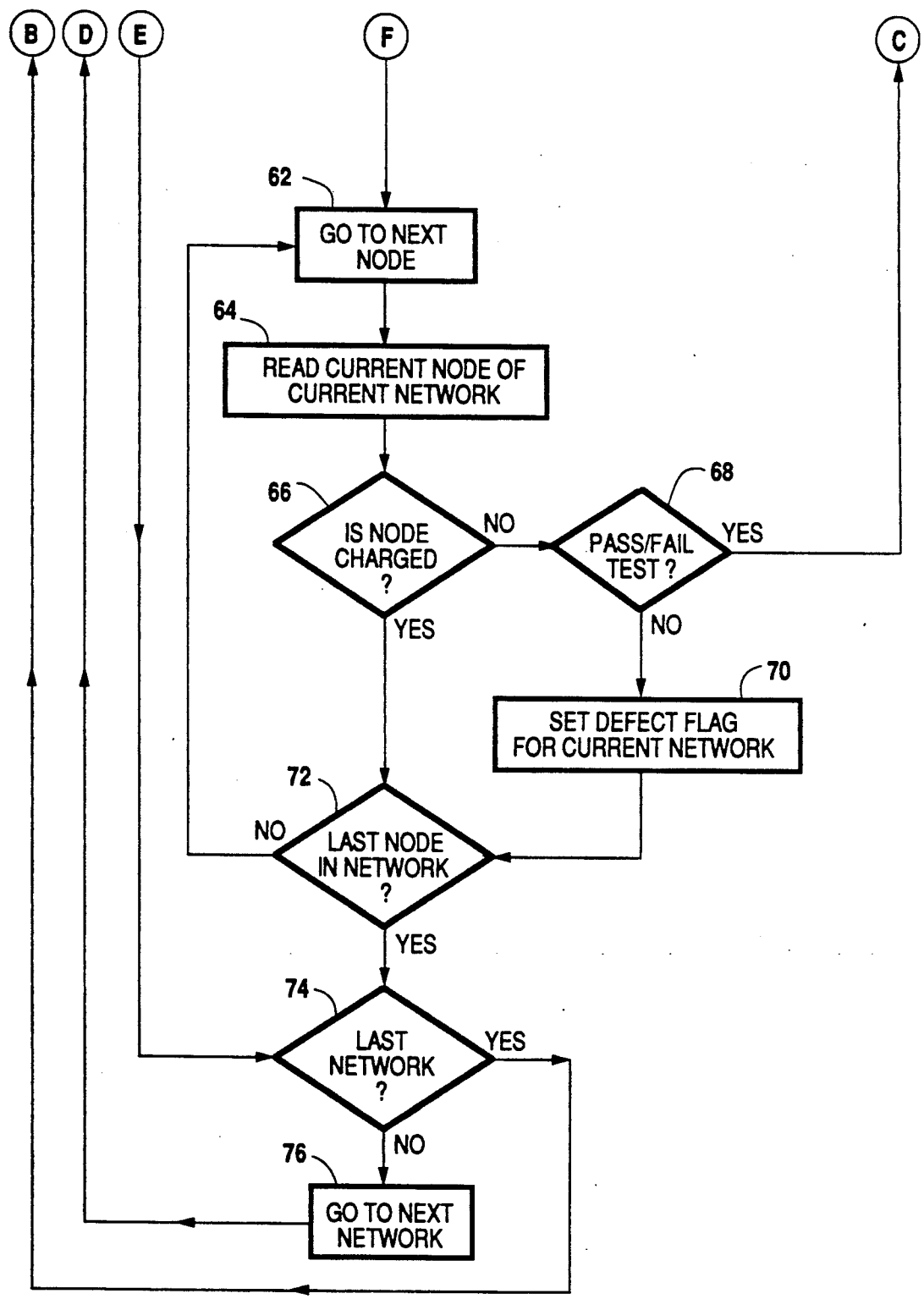

Referring now to FIGS. 3A-3B, a one-pass algorithm for charging and testing of the current segment in step 36 is described in greater detail. The test begins at step 38 which selects the first network, N1. It is to be noted that short-circuit detection loop of steps 42 through 54 are not required for the first network since the purpose of these steps is to detect a short to a previously charged network. For further optimization, decision step 40 can be included between steps 38 and 42 to branch to step 56 if the current network is the first network. Since the current network N1 is first network of the current segment S1, decision step 40 branches to step 56.

Starting with step 56, the open-circuit detection loop is started by determining whether there is one node in the network. It is noted that steps 58 through 72 are unnecessary if the network contains only one node since obviously a disconnect requires at least two nodes in the network. For further optimization, decision step 56 between steps 52 and 58 branches to step 74 if the current network has only one node. If additional nodes remain, as with network N1, or if step 56 is deleted, the test proceeds to step 58 In step 58, the first node 1a of the current network N1 is selected. In step 60, first node 1a is charged. In step 62, the node counter is incremented and the next node, node 1b, becomes the current node. In step 64 the charge on the current node of the current network is read. Since node 1b is charged, step 66 branches to step 72. Since the current node, node 1b, is not the last node, step 72 branches back to step 62 which selects the next node, node 1c, as the current node. The test proceeds through the open-circuit detection loop for nodes 1c and 1d, then decision step 72 detects node 1d as the last node in network N1 and branches to decision step 74. Since network N1 is not the last network in segment S1, step 74 branches to step 76 which selects the next network, network N2, as the current network, and returns the test to step 42.

In step 42 the short-circuit loop testing begins by selecting the first node of the current network, node 2a. In step 44, node 2a is read. Since defect D1 connects node 1d to node 2b, and node 2b is connected to node 2a, node 2a is charged. As a result, decision step 46 branches to pass/fail step 48. For illustration purposes, the test shall not be a pass/fail test. If the test were a pass/fail test, step 48 would branch to step 102 (FIG. 2) which would label the component "BAD", and the test would terminate at step 104 without charging or testing any other nodes. Returning to the example, the test branches to step 50 and sets the defect flag for the current network N2. The test continues at decision step 52. Since node 2a is not the last node in network N2, the test branches to step 54 which selects node 2b as the current node. In step 44, the charge on node 2b is read and the test proceeds as it did for node 2a. After nodes 2c and 2d are tested for shorts and found uncharged, the test branches to the open-circuit detection loop at step 56. When node 2c is selected in step 62 and found uncharged in step 64 due to defect D2, step 66 branches to pass/fail step 68. Since the present illustration is not pass/fail, instead of branching to step 102, in step 70 the defect flag for current network N2 is set and the test proceeds to step 72. Node 2c is not the last node in network N2 and the test branches to step 62. After node 2d is also found disconnected, the test goes to step 74. Since current network N2 is the last network in the current segment S1, the one-pass testing for shorts and disconnects in segment S1 is finished and the test returns to step 80 in FIG. 2.

Decision step 80 determines that segments S2 and S3 remain in set E. Since set E is not empty, the test proceeds to the short-circuit detection loop in steps 82-92 for finding nodes in set E which are shorted to the current (and charged) segment S1. The test branches to step 82 and selects the first node in set E, node 3a. In step 84, node 3a is read as uncharged, and step 86 branches to step 88 which determines that node 3a is not the last node in set E. The test continues at step 90 which selects the next node in set E, node 3b. Node 3b is found uncharged in step 86, step 88 finds no last node and step 90 selects the next node, node 3c. The short circuit detection loop continues for the remaining nodes in set E, nodes 3c-3d, 4a-4d, 5a-5d and 6a-6d. Since none of these nodes is shorted to the current segment, networks N1 and N2, and since the charge applied in testing networks N1 and N2 was insufficient to cause an accumulated charge effect, no shorts are detected. After the last node in set E, node 6d, has been tested, decision step 88 branches to step 96 which erases all charges on the networks in the component. For instance, the component may be subjected to a flood operation which is disabled after sufficient time has elapsed to erase the charges in the networks.

The test now proceeds to step 32 and removes another segment from set E. In the present illustration, segment S2 comprising networks N3 and N4 is removed. In step 34, segment S2 is labeled the current segment. In step 36, segment S2 is charged and tested for shorts and opens as described in FIGS. 3A-3B. The test then proceeds to step 80, which determines that set E contains segment S3, and branches to step 82. In step 82 the first node in set E is selected, node 5a. Even though defect D3 provides a short between node 4d (in the current segment S2) and node 5d (in set E), thereby charging node 5d, the open (defect D4) between nodes 5c and 5d prevents nodes 5a, 5b and 5c from being charged by node 5d. As a result, the test loops through the set E short-circuit detection loop three times without finding a fault. However, when node 5d is selected in step 90 and read in step 84, the charge is detected and step 86 branches to step 92. Since a pass/fail test is not used, decision step 92 branches to step 94 which sets the defect flag for the current network, N5. The test proceeds to step 88, which determines that additional nodes remain in set E, and step 90 selects node 6a as the current node. Defect D3 shorts node 4d in the current segment S2 to node 6d, and network N6 contains no defects. Consequently, all of nodes 6a, 6b, 6c and 6d are read as charged in step 64 when they are the current node. After node 6d is tested, decision branch 88 determines no nodes are left in set E and the charges are erased from the networks in step 96.

For the last time, the test branches to step 32 and removes the final segment S3 from set E, leaving set E empty. In step 34, segment S3 is labeled the current segment. In step 36, the defect D4 is detected when node 5d is found uncharged in step 64, causing the test to branch from step 66 to step 68 and set the defect flag for network N5 in step 70. Furthermore, defect D3 would be detected when any of nodes 6a, 6b, 6c and 6d is read as charged in step 44, causing step 46 to branch to step 48, which branches to step 50 to set the defect flag for network N6. Upon completion of step 36, the test proceeds to step 80. Since set E is empty, the test branches to step 98. Defect flags have been set for networks N2, N4, N5 and N6, so the test branches to step 102, labels the component "BAD" and terminates at step 104. Had no defects been detected, however, step 98 would have branched to step 100 to label the component "GOOD" and terminate the test at step 104.

The foregoing description of the method of testing electrical components for defects is based upon the illustrated flow-charts and is intended to give the overview of system logic which is executed according to the source code contained in the microfiche appendix. Conventional alterations of the flow-charts, source code or object code to meet other specified applications is a matter within the ordinary skill in the art.

The present invention, therefore, is well adapted to carry out the objects and attain the ends and advantages mentioned as well as others inherent therein. While presently preferred embodiments of the invention have been given for the purpose of disclosure, numerous changes in the details of construction and arrangement of parts will be readily apparent to those skilled in the art and which are encompassed within the spirit of the invention and the scope of the appended claims.

What is claimed is:

1. A method of electrically testing an electrical component with pads, comprising the steps of:

selecting a first portion of the component which is incapable of accumulating sufficient charge to cause any uncharged pad in the first portion to appear charged;

testing the first portion of the component by applying an electrical charge;

erasing accumulated charges in the component;

selecting a second portion of the component which is incapable of accumulating sufficient charge to cause any uncharged pad in the second portion to appear charged; and testing the second portion of the component by applying an electrical charge, thereby preventing the accumulated charges from causing false readings.

2. The method of claim 1, wherein when separately charged, the portions are incapable of accumulating sufficient charge to cause any uncharged pad in the component to appear charged.

3. The method of claim 1, wherein the testing detects shorts and disconnects.

4. The method of claim 1, wherein the component is an unpopulated high density multichip module and bonding pads on the top major surface of the module are tested.

5. The method of claim 1, wherein the testing is by voltage contrast electron beam testing and the charges are erased by flooding the component.

6. A method of electrically testing an electrical component, said component containing a plurality of electrical networks and each of said networks containing at least one node, wherein said method prevents accumulated charge in the networks from making uncharged nodes appear changed, comprising the steps of:

grouping the networks into a plurality of segments so that each segment contains one or more networks and each network belongs to a segment, wherein each segment is incapable of accumulating sufficient charge to cause any uncharged node to appear charged;

selecting an unselected segment as the current segment;

testing the current segment by applying an electrical charge;

erasing all charges in the networks after testing the current segment; and repeating said selecting step through said erasing step until either (1) a defective node is detected, or (2) every node has been tested without detecting any defective nodes.

7. The method of claim 6, wherein the charge applied to the current segment is incapable of making any uncharged node appear as charged after charging each node in the current segment, thereby preventing false readings from the accumulated charge effect.

8. The method of claim 7, wherein the testing detects shorted or disconnected nodes.

9. The method of claim 8, wherein the component is an unpopulated high density multichip module and the nodes are bonding pads on the top major surface of the module.

10. The method of claim 9, wherein the testing is by voltage contrast electron beam testing.

11. The method of claim 10, wherein the charges are erased by flooding the module.

12. The method of claim 11, further comprising: between said testing step and said erasing step, testing the pads in the unselected segments for shorts.

13. The method of claim 12, wherein the pads are tested separately and in sequence.

14. The method of claim 8, further comprising: between said testing step and said erasing step, testing the nodes in the unselected segments for shorts.

15. A method of electrically testing an electrical component, said component containing a plurality of electrical networks and each of said networks containing at least one node, wherein said method prevents accumulated charge in the networks from making uncharged nodes appear charged, comprising the steps of:

grouping the networks into a plurality of segments so that each segment contains one or more networks and each network belongs to a single segment, wherein each segment is incapable of accumulating sufficient charge to cause any uncharged node to appear charged;

grouping the segments into a set E;

removing a segment from set E to become the current segment;

charging the current segment with an electrical charge, said charge being insufficient to make any uncharged node in the networks appear charged, and testing the current segment for shorted or disconnected nodes;

testing the segments remaining in set E for shorted nodes;

erasing all charges in the networks after testing the current segment and testing the segments remaining to set E;

repeating said removing step through said erasing step; and terminating the test after either (1) a node is determined to be shorted or disconnected, thereby indicating the component is bad; or (2) every node has been tested for being shorted or disconnected and no node is determined to be shorted or disconnected, thereby indicating the component is good.

16. The method of claim 15, wherein the step of charging and testing the current segment comprises, for each network after the first network charged, before electrically charging any nodes in the network, testing all the nodes in the network to determine if any of the nodes are charged and thereby shorted to a previously charged network, and for each network, electrically charging one node in the network, then testing all the other nodes in the network to determine if any of said other nodes are uncharged and thereby disconnected.

17. The method of claim 15, wherein the step of charging and testing the current segment comprises, unless a node in any network has been determined to be shorted or uncharged, for at least each network after the first network charged, before electrically charging any nodes in the network, testing all the nodes in the network to determine if any of the nodes in the network are charged and thereby shorted to a previously charged network, and unless a node in any network has been determined to be shorted or uncharged, for each network, electrically charging one node in the network, then testing all the other nodes in the network to determine if any of said other nodes are uncharged and thereby disconnected.

18. The method of claim 15, wherein the step of charging and testing the current segment comprises:

(a) for the first network to be charged, charging a node in the first network and testing all the other nodes in the first network to determine if any of said other nodes in the first network are uncharged and thereby disconnected, (b) for a network, besides the first network, testing all the nodes in the network before the network is charged to determine if any of the nodes are charged and thereby shorted to a previously charged network, and (c) for a network, besides the first network, that has already been tested for shorted nodes, charging a node in the network and testing all the other nodes in the network to determine if any of the other nodes are uncharged and thereby disconnected.

19. The method of claim 15, wherein during the step of charging and testing the current segment, separate networks are tested for shorts separately and in sequence, and after the current network is tested for shorts and no shorts are determined to exist in the current network, before charging or testing any nodes in a network besides the current network, charging a node in the current network and testing all the other nodes in the current network to determine if any of the other nodes in the current network are uncharged.

20. The method of claim 15, wherein separate networks are charged and tested separately and in sequence.

21. The method of claim 15, wherein no charging occurs during the step of testing the segments remaining in set E.

22. The method of claim 15, wherein after a node is determined to be shorted or disconnected, the test is terminated before charging any other nodes.

23. The method of claim 15, wherein after a node is determined to be shorted or disconnected, the test is terminated before testing any other nodes.

24. The method of claim 15, wherein the step of charging and testing of the current segment is completed before testing any segment remaining in set E.

25. The method of claim 15, wherein the steps beginning with removing a segment and ending with returning to said removing step are performed separately.

26. The method of claim 15, wherein the steps beginning with removing a segment and ending with returning to said removing step are performed in sequence.

27. The method of claim 15, wherein a contactless method is used for charging and testing the networks.

28. The method of claim 27 wherein said contactless method is voltage contrast electron beam testing.

29. The method of claim 15, wherein the component is an unpopulated high density multichip module and the nodes are bonding pads on the top major surface of the module.

30. A method of electrically testing an unpopulated electrical component with an electron beam for shorted or disconnected nodes, said component containing a plurality of electrical networks and each of said networks containing at least one node, wherein said method prevents accumulated charge in the networks from making uncharged nodes appear charged, comprising the steps of:

grouping the networks into a plurality of segments so that each segment contains one or more networks and each network belongs to a single segment, and grouping the segments into a set E, wherein each segment is incapable of accumulating sufficient charge to cause any uncharged node to appear charged; then performing steps (1) through (5) separately in the sequence set forth:

(1) selecting and removing a segment from set E to become the current segment;

(2) charging the current segment with an electrical charge, said charge being insufficient to make any uncharged node in the networks appear charged, and testing the current segment for shorted or disconnected nodes;

(3) testing the segments remaining in set E for shorted nodes;

(4) erasing all charges in all networks; and (5) returning to step (1); and terminating the test after either a node is determined to be shorted or disconnected, and labeling component as bad; or set E is empty, every node has been tested for being shorted or disconnected, no node is determined to be shorted or disconnected, and labeling the component as good.

31. The method of claim 30, wherein in steps (2) and (3), separate networks are tested separately and in sequence.

32. The method of claim 30, wherein in step (2), after the first network is charged and tested for disconnects, the other networks are, separately and in sequence, tested for shorts to a previously charged network, then charged, and then tested for disconnects.

33. The method of claim 30, wherein in step (3), the networks in set E are tested separately and in sequence.

34. The method of claim 30, wherein said method is the first pass of a test algorithm which performs further testing of the component.

35. The method of claim 34, further comprising a second pass test which provides a complete functional description of network interconnection.

* * * * *

UNITED STATES PATENT AND TRADEMARK OFFICE
CERTIFICATE OF CORRECTION

PATENT NO.    : 5,192,913
DATED         : March 9, 1993
INVENTOR(S)   : Rama R. Goruganthu, et al It is certified that error appears in the above-indentified patent and that said Letters Patent is hereby corrected as shown below:

Column 6, line 26, delete "the" after "step 36B".

Column 6, line 33, change "Or" to -- or --.

Column 6, line 59, insert -- . -- after "to step 58".

Column 7, line 64, insert --. -- after "removed".

Column 9, line 9, insert --, -- after "wherein".

Column 9, line 27, change "changed" to -- charged --.

Column 10, line 23, change "to " to -- in --.

Column 11, line 43, insert -- , -- after "claim 27".

Signed and Sealed this

Twenty-second Day of March, 1994

Attest:

BRUCE LEHMAN

*Attesting Officer*     *Commissioner of Patents and Trademarks*